United States Patent [19]

Ma et al.

[11] Patent Number: 5,280,446
[45] Date of Patent: Jan. 18, 1994

[54] FLASH EPROM MEMORY CIRCUIT HAVING SOURCE SIDE PROGRAMMING

[75] Inventors: Yueh Y. Ma, Los Altos; Kuo-Tung Chang, San Jose, both of Calif.

[73] Assignee: Bright Microelectronics, Inc., Santa Clara, Calif.

[21] Appl. No.: 895,311

[22] Filed: Jun. 8, 1992

Related U.S. Application Data

[63] Continuation-in-part of Ser. No. 585,811, Sep. 20, 1990, abandoned.

[51] Int. Cl.$^5$ .............................................. G11C 11/40
[52] U.S. Cl. .................................... 365/185; 365/218; 257/314; 257/316
[58] Field of Search ....................... 365/185, 900, 218; 257/314, 315, 316, 317, 320, 321, 327

[56] References Cited

U.S. PATENT DOCUMENTS

| | | | |
|---|---|---|---|
| 4,462,090 | 7/1984 | Iizuka | 365/185 |
| 4,531,203 | 7/1985 | Masuoka et al. | 365/185 |
| 4,868,629 | 9/1989 | Eitan | 365/185 |
| 4,939,558 | 7/1990 | Smayling et al. | 357/23.7 |
| 4,988,635 | 1/1991 | Ajika et al. | 357/23.5 |
| 4,989,053 | 1/1991 | Shelton | 365/185 |

FOREIGN PATENT DOCUMENTS

| | | | |
|---|---|---|---|
| 01-52672 | 6/1989 | Japan | 365/185 |
| 0304784 | 12/1989 | Japan | 365/185 |

OTHER PUBLICATIONS

S. Sze, "Semiconductor Devices-Physics and Technology, " ©1985 Bell Tel. Labs, pp. 375-377.

Primary Examiner—Eugene R. LaRoche
Assistant Examiner—Vu A. Le
Attorney, Agent, or Firm—Townsend and Townsend Khourie and Crew

[57] ABSTRACT

A flash EPROM memory array which operates at lower voltage power supply with no disturbance during operation. The memory circuit comprises a plurality of memory elements in a matrix fashion with each element including a semiconductor substrate, a drain region, a source region, a floating gate, a control gate, and a select gate. The low voltage power supply operation capability is achieved by a special arrangement on the said memory array such that the programming of the memory cell is achieved by high efficient hot electron injection which allows lower drain voltage during programming. No disturbance during program and erase occurs due to a control gate line running in parallel with the drain line. No disturbance access during read operation because of alternating drain and source lines such that the memory device can be read from the source side.

5 Claims, 8 Drawing Sheets

(PRIOR ART)

FIG. 2B

(PRIOR ART)

FLASH EPROM MEMORY CIRCUIT HAVING SOURCE SIDE PROGRAMMING

This is a continuation-in-part of application Ser. No. 07/585,811, filed Sep. 20, 1990, abandoned.

BACKGROUND OF THE INVENTION

1. Field of the Invention

This invention relates to a flash EPROM memory array architecture, and more particularly the invention relates to a memory array which can be operated at a low voltage power supply with minimal gate and drain disturbance during operation.

2. Field of Prior Art

Figure 1A:
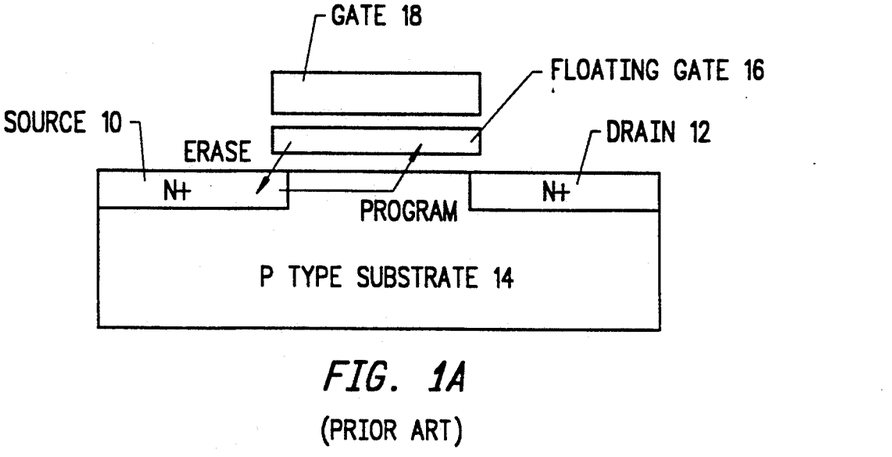
FIG. 1A is a section view of a flash EPROM memory device in the prior art.

FIG. 1A is a section view of a prior art flash EPROM device in which an N+ source 10 and N+ drain 12 are formed in the surface of a P− semiconductor substrate 14. A floating gate 16 is provided between a control gate 18 and the surface of the substrate 14, and between the source 10 and the drain 12. The device is programmed to a high threshold voltage state by applying high voltage (about 6.5 to 7 volts) on the drain and high voltage (about 12–13 volts) on the control gate so that hot electrons are injected into the floating gate near the edge of the drain junction. The programming efficiency of the device in FIG. 1A strongly depends on the channel length, channel doping concentration, doping profile of the drain junction, and especially, the drain voltage since the programming occurs at the drain side of the floating gate transistors, referred to herein as drain side programming.

The typical drain voltage for drain side programming is about 6.5 to 7 volts and the typical programming current is in the range of 500 uA to 1 mA per bit. The 6.5 to 7 volts of programming voltage usually is obtained by reducing it from a separate 12 volts power supply. Thus, the memory circuit operation needs two power supplies: a 5 volts power supply and a 12 volts power supply. To use a single low voltage power supply (e.g. 5 volts) operation, either a very large charge pump is needed to supply the large programming current which is in the range of several milliamperes for one byte (8 bits) of programming, or a heavily doped channel concentration with specially designed drain junction is needed so that enough programming speed is provided and at the same time soft-write during read operation (read disturb) is avoided. Both of the approaches are difficult to achieve.

Erase of the device in FIG. 1A is achieved either by applying a high voltage (about 12 to 13 volts) on the source 10 and ground to the control gate 18, or by applying 5 volts on the source 10 and a negative voltage (about −11 volts) on the control gate 18. One big problem of this device during erase operation is that is cannot be over-erased. If the device is over-erased to become a depletion transistor, it will conduct leakage current during the read operation of the other memory cells, for the same accessed bit line.

Read operation of the device is achieved by applying a low voltage (about 1 volt) on the drain 12 and 5 volts on the control gate 18. The low threshold voltage cell (non-programmed cell) will conduct current and is read as a '1' state, and the high threshold voltage cell (programmed cell) will not conduct current and will be read as a '0' state.

Figure 1B:
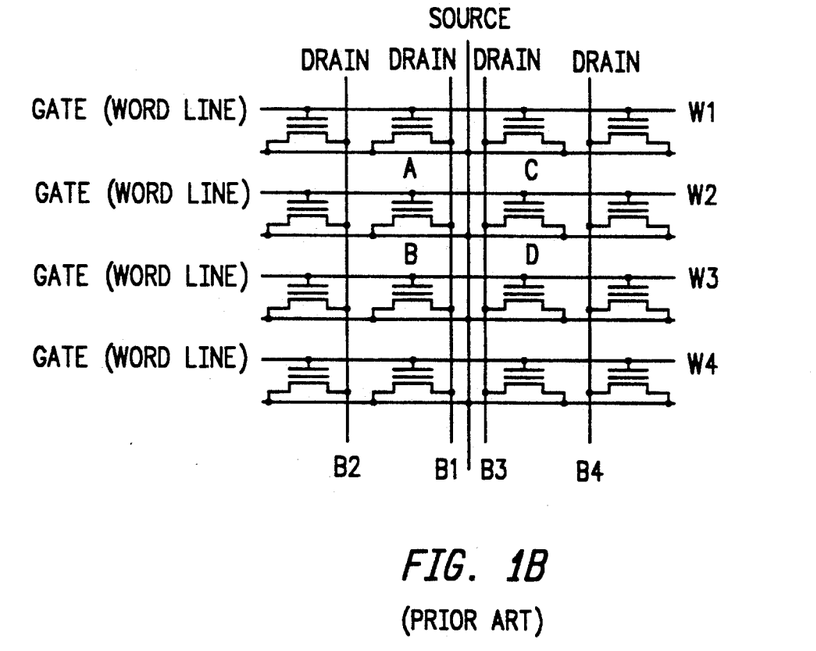
FIG. 1B is a typical memory array for said memory devices.
Figure 1C:
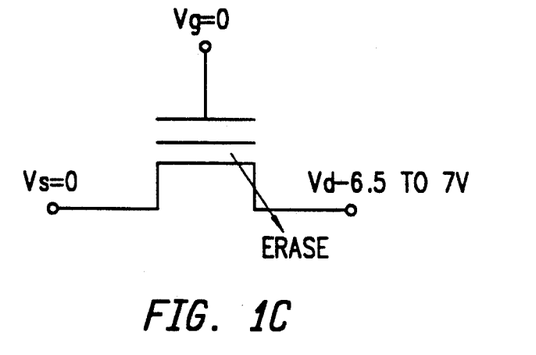
FIG. 1C shows the drain disturb condition.

A typical memory array architecture using the device in FIG. 1A is shown in FIG. 1B. In this array architecture, the control gates extend in one direction to form word lines and the drains extend in another direction to form bit lines with the bit lines perpendicular to the word lines. Usually, 8 or 16 bit lines share one common source line. The access of a certain memory cell is achieved by selecting one bit line and one word line, and the cell at the cross point of the selected bit line and word line is selected. During the programming of the selected cell A, selected bit line B1 is at 6.5 to 7 volts and selected word line W1 is at 12 volts and all the other unselected lines are at 0 volt. In this situation, cell A will be programmed to high threshold voltage. However, the memory cell B which is connected to the selected bit line but on an unselected word line is stressed at high drain voltage with gate grounded as shown in FIG. 1C. This condition is usually called drain disturb. For the case of 100 Å first gate oxide thickness and 15% of drain coupling, the electric field between the drain and the floating gate is about 5.5 to 6 MV/cm under the drain disturb condition as shown in FIG. 1C.

The drain disturb on cell B occurs not only during the programming of the cell A but also during the programming of the rest of the cells connected to the same bit line B1. If cell B has been programmed to high threshold voltage prior to cell A and the rest of the cells connected to bit line B1, this high drain voltage may discharge the floating gate charge of the cell B by the electric field between the floating gate and the drain. As described above, the programming of the memory cell in this array architecture is achieved by drain side hot electron injection. The drain voltage during programming cannot be too low otherwise the programming speed will be too slow. But, the drain voltage during programming cannot be too high because of the drain disturb condition that limits the drain voltage during programming for this array architecture. The limitation on the drain voltage necessitates very high channel doping for optimizing the programming performance. However, high channel doping creates other disturbance problems such as read disturb, and also reduces the bit line junction breakdown voltage which makes the erase junction difficult to optimize. Thus, the drain disturb during programming imposes a limitation on the process window and scaling of the array.

Figure 1D:
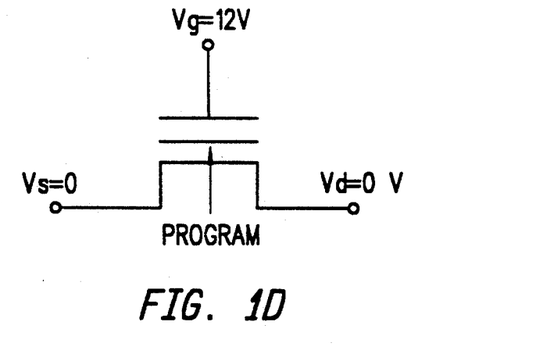
FIG. 1D shows the gate disturb condition for said memory device.

Besides the drain disturb, this array architecture also has gate disturb problems during programming. For example, during programming of the selected cell A, the memory cell on the unselected bit line and on the selected word line such as cell C is under the stress condition as shown in FIG. 1D, which is called gate disturb. The 12 volts on the control gate and 0 volt on both drain and source will result in about 6 MV/cm of electric field between the floating gate and the substrate surface if 50% of control gate coupling is used and may cause electron tunneling from the substrate into the floating gate through the thin dielectric (typically 100 Å) during the program operation of cell A and any other cell connected to word line W1. The gate disturb condition limits the maximum voltage that can be used on the control gate for programming such that the programming performance cannot be optimized by increasing the word line voltage. This also burdens the optimization of the programming performance. Both the drain disturb and the gate disturb conditions in this array architecture narrow the process window and reduce the design margin.

Assume the memory array as shown in FIG. 1B is separated into small blocks with several word lines as a memory block. During erase of the memory cell of the selected memory block such as cells A and C by employing the negative gate erase scheme, a −11 volts will be applied on the selected word line W1 and 5 volts will be applied on the common source line such that the charge on the floating gates of cells A and C can be discharged by the electric field between the floating gate and the source. However, the source of the unselected cells B and D will also have 5 volts on it since cell B and D share the same source with cells A and C. Considering the situation that cells A and C are programmed and erased for 10,000 cycles with typically erase time of 1 second for each erase cycle, the source of the cells B and D will be stressed by 5 volts for at least 10,000 seconds. Charge on the floating gate can be easily discharged by this stress condition. Usually this erase disturb is prevented by adding a pass transistor which can be selectively turned off to block the source voltage for the unselected cells. However, this adds some overhead on the chip size and complicates the circuit design.

Besides the disturb conditions during program and erase, the memory architecture as shown in FIG. 1B also suffers from the read disturb during read operation if the memory cell is not optimized. The read operation on cell A is achieved by applying a low voltage about 1 volt on the bit line B1 and 5 on the word line W1. The bit line voltage cannot be too high because the high bit line voltage on the drain of cell A and 5 volts gate voltage is under a programming condition, albeit slow programming. Since the channel doping is usually very high for optimizing the programming speed, channel doping also enhances the programming of the cell during a read condition. Thus, optimization of the channel doping and special designed drain junction are usually needed for this type of array architecture.

To summarize, all the above disturbance conditions are caused by the array architecture in which a word line is arranged to be perpendicular to both the drain and the source lines such that all the unselected cells will be stressed either by high control gate voltage or high drain/source voltage with all other terminals grounded. The common source architecture also creates disturbance during the erase operation and cannot prevent the disturbance during a read operation. All of these disturb conditions narrow the process window and make the optimization and scaling of the memory cell difficult.

Figure 2A:
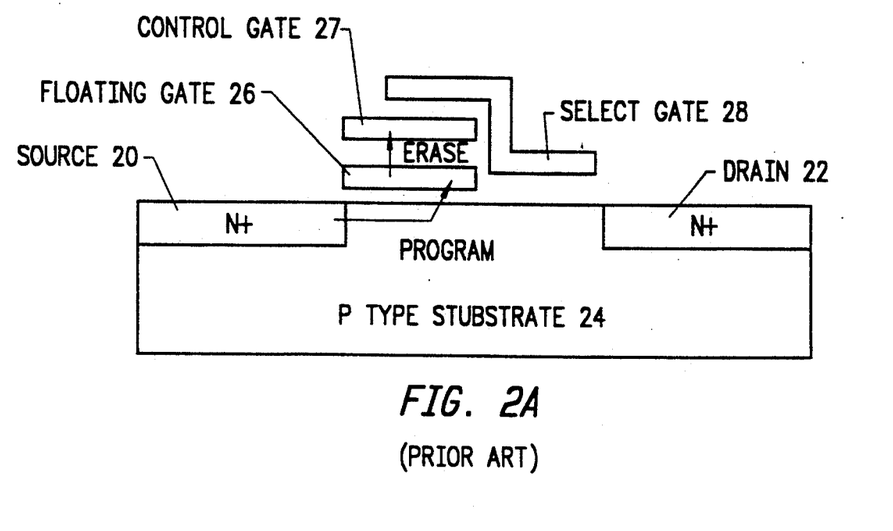
FIG. 2A is a section view of a flash EPROM memory device in the prior art using three polysilicon layers.

FIG. 2A is a section view of a prior art memory device again having N+ source 20 and N+ drain 22 in a surface of P-substrate 24 with floating gate 26 between a control gate electrode 27 and the surface of the substrate 24, both of which overlap the source and a portion of the channel region. An addressing gate electrode 28 is formed on the control gate electrode, and extends to a portion of the channel region not covered by the floating gate and the control gate electrodes. Erase of the device in FIG. 2A is achieved by applying about 50 volts on the control gate to remove electrons from the floating gate through the dielectric between the floating gate and the control gate by Fowler-Nordheim tunneling. Due to the presence of the addressing gate, this device will not leak current even if the floating gate transistor is over-erased because the addressing gate can still turn off the device. The structure as shown in FIG. 2A effectively includes a floating gate transistor and an addressing gate transistor in series and is referred to a split gate structure.

Programming of this device is done by applying 25 volts on the control gate 27 and by applying 10 volts on both the drain 22 and the addressing gate 28. The high drain voltage is transferred by the addressing gate to the drain side of the floating gate transistor. The electrons moving through the channel cause an impact ionization near the drain side of the floating gate transistor due to a high electric field and thereby produce hot electrons with the high energy. Part of the hot electrons are injected into the floating gate 26 due to the high voltage coupling from the control gate 27 such that the device assumes a high threshold voltage state. Since the hot electrons are generated near the drain edge of the floating gate transistor, this programming mode is drain side injection and is the same as the device in FIG. 1A. Thus, the device in FIG. 2A still needs high drain voltage for programming and operating voltage is difficult to reduce.

Figure 2B:
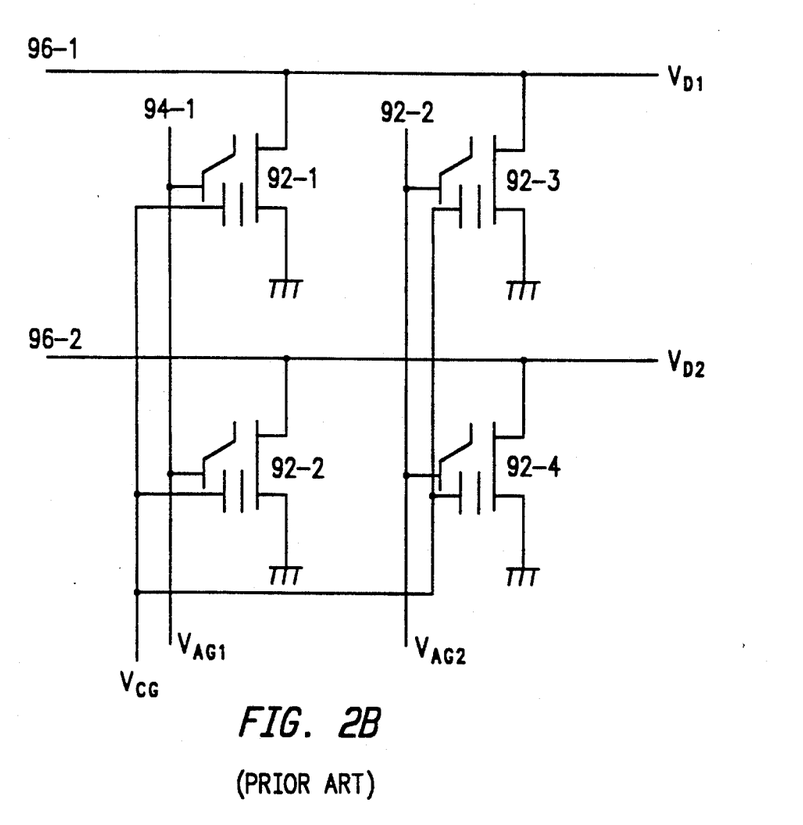
FIG. 2B is a typical memory array for said memory devices.

The memory array architecture of the device in FIG. 2A is shown in FIG. 2B. In this array architecture, the control gate line runs perpendicular to the drain lines, and the addressing gate runs parallel with the control gate. This architecture does not have the drain disturb problem since its drain is not overlapped with the floating gate. However, the source region is self-aligned and overlapped by the floating gate. During programming of the cell 92-1, 10 volts are applied to the $V_{D1}$ and $V_{AG1}$ and 25 volts are applied to the $V_{CG}$. Since all the control gates are at 25 volts and all the sources of the unselected cells 92-2 92-3, and 92-4 are at 0 volt, the unselected cells will have the gate disturb problem since the electrons may tunnel from the source into the floating gate through the thin dielectric between the floating gate and the source. One way to prevent this is to use thicker dielectric between the floating gate and the substrate. This necessitates that the memory cell be erased by electron tunneling through the dielectric on top of the floating gate instead of erased through the dielectric underneath the floating gate. However, erase through the dielectric on top of the floating gate usually is not uniform because the quality of the dielectric on the floating gate (oxide grown from polysilicon) is not as good as that grown from the substrate which is single crystalline silicon.

Figure 3A:
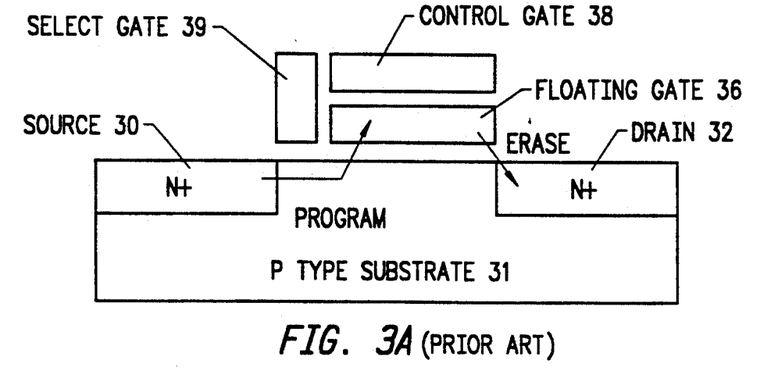
FIG. 3A is a section view of a flash EPROM memory device in the prior art using sidewall spacer as the third gate electrode.

FIG. 3A is a section view of another prior art device which overcomes the over-erase problem by a split gate structure and can be programmed with lower drain voltage (5 volts instead of 6.5 to 7 volts) by using a different mechanism for hot electron injection. The advantage of using 5 volts on the drain for programming is the extra 12 volts power supply is not needed for this memory circuit operation and only a single low voltage (5 volts or 3 volts) power supply is needed. The device of FIG. 3A use a triple polysilicon structure including a floating gate 36, a control gate 38 and a select gate 39. The control gate 38 and the floating gate 36 overlap a portion of the channel region adjacent to the drain 32, and the select gate overlies another portion of the channel region adjacent to the source 30. Erase of the device is by applying a high voltage on the drain 32 and 0 volt on the control gate 38. Since it is a split gate structure, this device also does not have the over-erase concern.

Programming of the device is achieved by applying 5 volts on drain, 15 volts on the control gate, and about 1.5 to 2 volts on the select gate. The high control gate voltage heavily turns on the floating gate transistor and transfers the 5 volts drain voltage to the source side of the floating gate transistor. A high potential drop occurs at the substrate surface near the source edge of the floating gate transistor. The electrons in the channel are accelerated by this high potential drop and become hot electrons which can inject into the floating gate by high control gate voltage coupling. Since the hot electrons are generated and injected into the floating gate at the source side of the floating gate transistor, this programming mode has been referred as source side injection. It has been demonstrated that the source side injection can be 1000 times more efficient than the drain side injection. This is the reason why the device in FIG. 3A can be programmed with a lower drain voltage compared to the devices in FIG. 1A and FIG. 2A in which drain side injection is used. Moreover, since the select gate transistor is only slightly turned-on, the programming current is determined by the select transistor which can be less than 20 uA per bit. If further reduction of power supply is needed such as $V_{cc}=3$ volts, the 5 volts drain voltage for programming is easily obtained by a charge pump circuit due to this small programming current. This indicates that it is possible to reduce the power supply voltage by implementing the source side injection method.

Figure 3B:
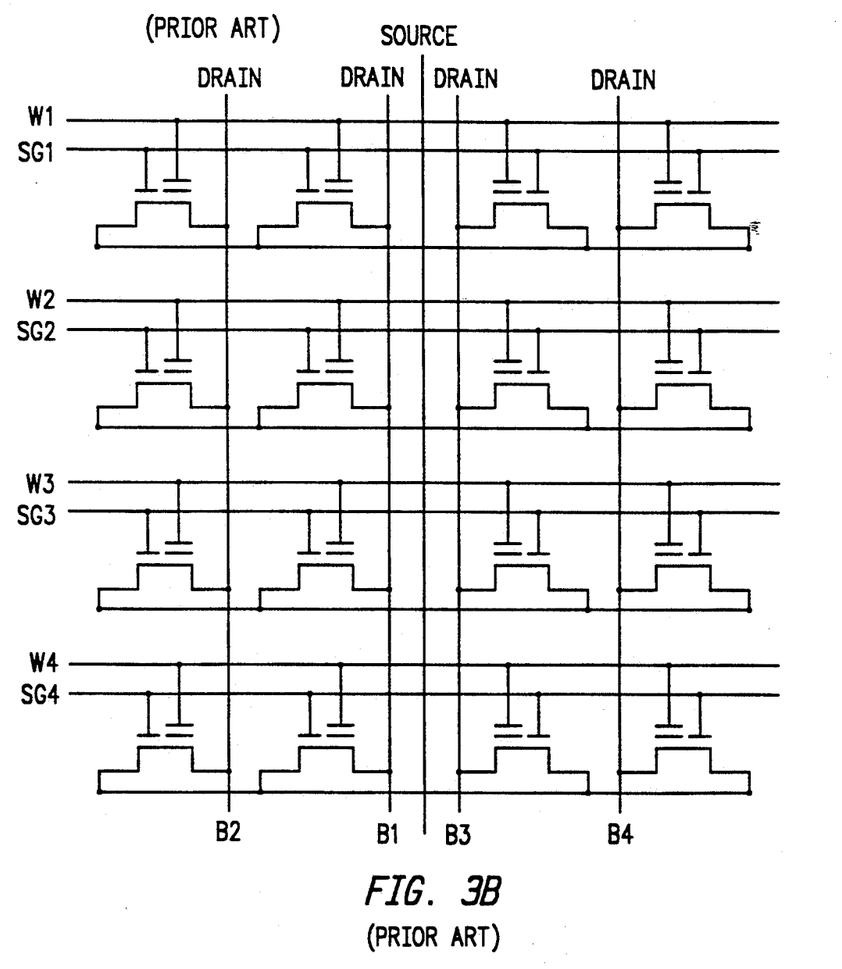
FIG. 3B is a typical memory array for said memory devices.

A typical memory array architecture of the device in FIG. 3A is shown in FIG. 3B. In this array architecture, the select gate 39 is formed by anisotropic etch of a third layer of polysilicon to form a sidewall gate structure adjacent to the control gate such that the orientation of the select gate line needs to be the same as the control gate. This requires that the select gate line be in parallel with the control gate line. Also, in this array architecture, the control gate and the select gate need to be perpendicular to the drain lines such that the access of a particular memory cell is achieved at the location where the bit line crosses with the control gate line and the select gate line. Since the selected bit line is perpendicular to the selected control gate line, it has the drain disturb and gate disturb concerns as described previously for the array architecture in FIG. 1B. Further, since the select gate 39 in FIG. 3A is formed by a sidewall etchback technique, it is difficult to apply silicide to form a silicide sidewall structure. Consequently, the RC delay along the select gate line will be large and degrade the speed performance of the memory circuit.

Thus, it is possible to use a single low voltage power supply for memory circuit operation if a source side injection mode is used. However, the array architecture as shown in prior art FIG. 3B will have both drain and gate disturb problems because the control gate line is arranged perpendicular to the drain lines, and the access of the memory cell is achieved at the location where the bit line crosses with both the control gate line and the select gate line. All these disturbances will reduce the endurance and degrade the reliability of the circuit. For major applications of flash memory such as for data storage, both the endurance and the reliability are critical. The only way to prevent these disturb conditions is to have a new array architecture such that the control gate line is in parallel with the drain lines and make the select gate line perpendicular to both the control gate and the bit line. The access of the memory cell is achieved at the location where the select gate line crosses with both the control gate line and the bit line. All the high voltage during program and erase is applied only to the control gate and the bit line, and the select gate line voltage is always kept as low as 0-2 volts.

It is therefore the main object of this invention to provide a new memory array architecture having the advantages of using source side injection for programming and with minimal disturbance during operation of the memory circuit.

SUMMARY OF THE INVENTION

Accordingly, an object of the invention is a flash EPROM memory array architecture for operating at a single low voltage power supply.

Another object of the invention is a flash EPROM memory array architecture with minimal disturbance during program, erase, and read operations.

Briefly, a semiconductor memory device in accordance with the invention comprises a semiconductor substrate of a first conductive type; a first gate insulation layer formed on the major surface of the substrate; a first gate electrode formed on the first gate insulation layer partially overlapping the channel region and acting as a floating gate; a second gate insulation formed on the first gate electrode; a second gate electrode formed on the second gate insulation layer and overlapping the first gate electrode; source and drain regions formed in the semiconductor substrate and of a second conductive type opposite to that of the first conductivity type with the channel region therebetween. The drain region is self-aligned with the first and the second gate electrodes. The source region is laterally spaced from the first gate electrode, and the substrate area between the first gate electrode and the source region forms a part of the channel region which is not covered by the first and the second gate electrodes. A third gate insulation layer is formed on the top of the second gate electrode and the sidewall of the first gate and the second gate electrodes; and a third gate electrode is formed on the third gate insulation layer and extends to a portion of the channel region not covered by the first and the second gate electrodes. The third gate electrode extends in a direction which is perpendicular to a drain extension, a source extension, and a second gate extension, and runs over the second gate extension, the drain region, and the source region. An equivalent circuit of the device is a select gate transistor serially connected with a floating gate transistor.

A memory array architecture in accordance with the invention has a plurality of said memory devices in a matrix fashion such that the drain regions are connected together as a column (drain extension); the source regions are connected together as another column (source extension); the second gate electrodes are connected together as a column (polysilicon line) and is in parallel with the drain and the source columns; and the third gate electrodes are connected together in a row perpendicular to the columns. The drain column and the source column can be arranged in an alternating column.

During programming of the memory device, a fixed voltage (5 volts) is applied to the drain, another fixed voltage (12 volts) is applied to the second gate electrode and a fixed voltage (2 volts) is applied to the third gate electrode. The channel region underneath the first gate electrodes is strongly turned on by the voltage coupling from the second gate electrode and the channel region underneath the third gate electrode is weakly turned on by the voltage applied to the third gate electrode. Programming of the device is achieved by source side injection mode in which the programming efficiency is higher than drain side injection so that drain voltage during programming can be as low as 5 volts. The weakly turned-on select transistor also limits the channel current during the program operation of the memory device so that the drain voltage can be easily obtained by a charge pump circuit if a further reduction on power supply (such as 3 volts) is required.

As a flash EPROM memory array architecture having a plurality of said memory devices in a matrix fashion and during programming of a selected device, a fixed voltage (5 volt) is applied to the selected drain line and the other fixed voltage (12 volt) is applied to the selected second gate line. Since the selected drain line and the selected second gate line are in parallel, all the devices (including the selected device and the unselected devices) belong to the same selected drain line will be applied with 5 volts on the drain and 12 volts on the gate such that there will be no drain or gate disturb conditions for the unselected cells within the same selected drain lines. Erase of the devices on the selected drain line is achieved by applying a fixed voltage (5 volts) on the selected drain line and a fixed negative voltage ($-11$ volts) on the selected second gate line. All the other unselected devices will be 0 volt on both the drain and the second gate such that no disturbance will occur during the erase operation. Moreover, the drain lines and the source lines in the memory array are arranged in an alternating way such that voltage is put on the source side of the device during the read operation. Since the source is not adjacent to the floating gate, there will be no read disturb concern during the read operation.

The invention and objects and features thereof will be more readily apparent from the following detailed description and appended claims when taken with the drawings.

DETAILED DESCRIPTION OF THE ILLUSTRATIVE EMBODIMENTS

Figure 4:
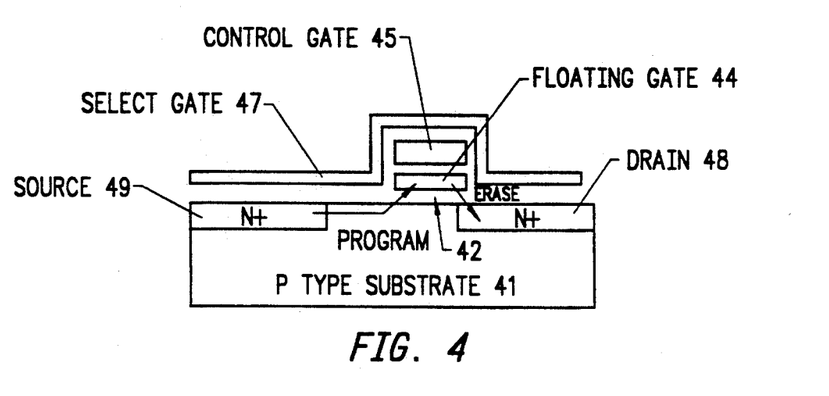
FIG. 4 is a section view of a flash EPROM memory device in accordance with the present invention.

FIG. 4 is a section view of a flash EPROM device in accordance with the present invention. A major surface of a semiconductor substrate 41 is first oxidized to form a thin insulation layer 42. A first doped polysilicon layer is deposited on the first insulation layer with a second insulation layer on top of the first polysilicon layer. The second insulation layer can either be a silicon dioxide from the oxidation of the first polysilicon layer or a combination of silicon dioxide and silicon nitride (ONO). The second insulation layer and the first polysilicon are patterned and etched to form the floating gate 44. A second polysilicon layer is then deposited on the second insulation layer, patterned, and etched to form the control gate 45, and the first polysilicon layer is also etched with the same mask and to form the floating gate 44. A drain region 48 and a source region 49 are formed by ion implantation of N type dopant using a photoresist mask which partially covers the double polysilicon stack and extends to cover an adjacent portion of the channel which is not covered by the double polysilicon stack. After a fourth insulation layer is formed over the double polysilicon stack, a third conductive layer is deposited, patterned, and etched to form the select gate 47. Since the third gate electrode is formed after the formation of the drain region 48 and source region 49, it runs over the control gate electrode 45, the drain region 48, and the source region 49. In a preferred embodiment, the third conductive layer will be made of impurity doped polysilicon with metal silicide on top of it to reduce the RC delay.

Figure 7:
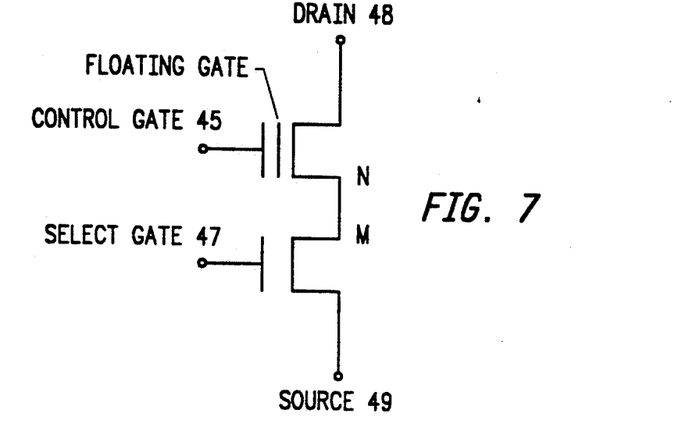
FIG. 7 shows an equivalent circuit of the memory device in FIG. 4.

The equivalent circuit of the device in FIG. 4 is shown in FIG. 7. During programming of the device, 5 volts are applied to the drain 48, 12 volts are applied to the control gate 45, and 2 volts are applied to the select gate 47. The channel region underneath the floating gate 44 is strongly turned on and the 5 volts drain voltage is transferred to the source side of the floating gate transistor (location N in FIG. 7). The channel region underneath the select gate is weakly turned on such that the potential drop across the channel region underneath the select gate is very small and the potential at location M is very close to zero. This creates a potential drop between locations M and N. The channel electrons are accelerated between locations M and N by this potential drop and become hot electrons. These hot electrons can inject into the floating gate by the voltage coupling from the control gate. Since the hot electrons are injected into the floating gate at the source side of the floating gate, this operating mode is the same as the source side injection as described in the prior art in FIG. 3A.

Figure 5:
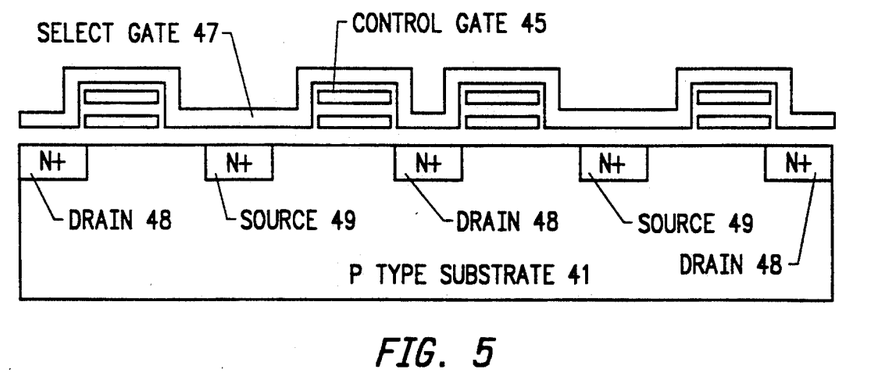
FIG. 5 is a section view of four flash EPROM memory devices of FIG. 4 arranged in a memory array.
Figure 6:
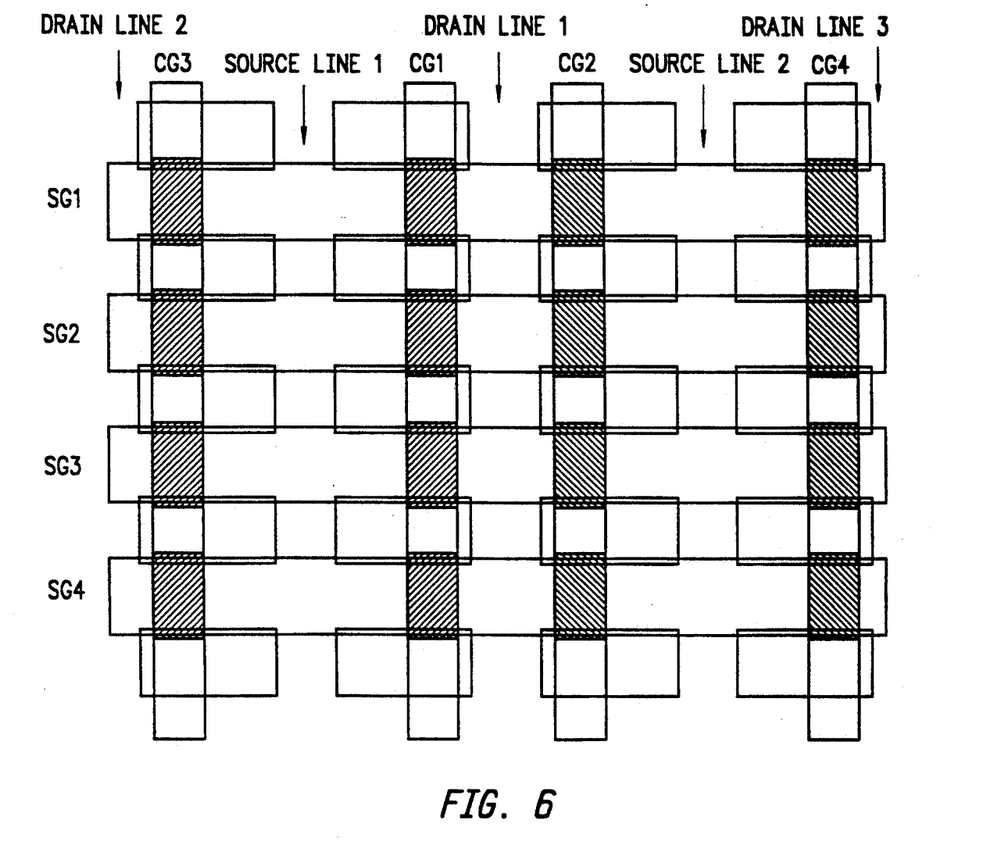
FIG. 6 is a plan view of the memory array of FIG. 5 in which four rows and four columns of said memory device are used.

FIG. 5 is a section view of four memory devices of FIG. 4 arranged in a memory array. The select gate 47 extends in one direction to run over the control gate 45, the drain region 48 and the source region 49 and is perpendicular to the control gate extension 45. The drain region 48 and the source region 49 are extended to run in parallel with the control gate extension CG and are alternately arranged as shown in FIG. 6 for a memory array arrangement of four rows and four columns of said memory devices. The control gates, the drains, and the sources are in the column direction and the select SG gates are in the row direction. The drain and source column resistance can be minimized by using overlying metal lines with a contact to the source or drain column for every 64 rows of select gate lines.

Figure 8:
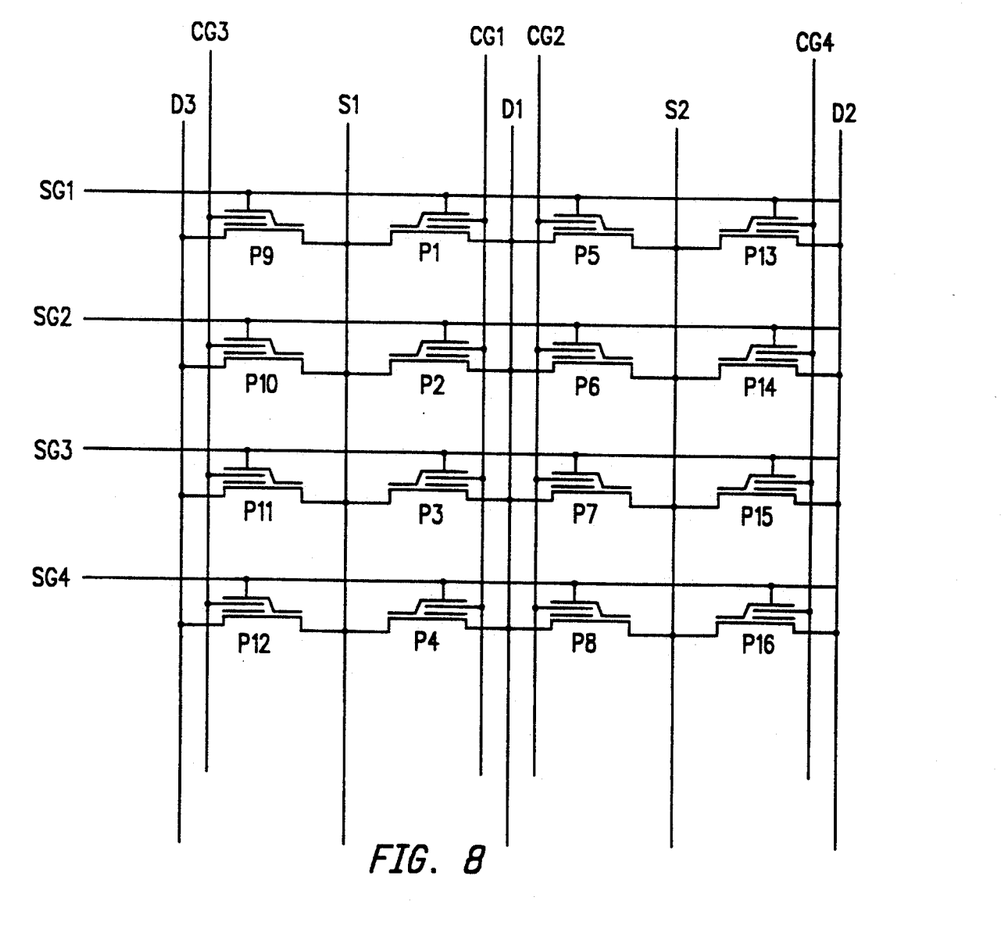
FIG. 8 is a memory array in accordance with the present invention in which four rows and four columns of memory devices in FIG. 4 are used.

FIG. 8 shows a memory diagram of four rows and four columns of memory devices. During the programming of the memory cell P1, 5 volts are applied to the drain line D1 and source line S2, and 12 volts are applied to the control gates CG1 and CG2. A low voltage of about 2 volts is applied to the select gate SG1. All the other lines are grounded. The purpose of applying 5 volts on source line S2 is to prevent the programming on the unselected cell P5 which is next to the selected cell P1 on the same row. The 0 volt between D1 and S2 will not create hot electrons to program the cell P5. Further, since S2 is not overlapped with any floating gate, this will also not create any disturbance condition. The selected memory cell P1 is programmed under the source side injection condition as described above. This makes it possible to operate this memory circuit by using a single 5 volts power supply. During programming, the select gate is applied with only 2 volts such that the programming current is limited by this select gate transistor and is only about 20 $\mu$A per bit. This low programming current facilitates a 5 volts drain voltage through a charge pump circuit if further reduction in power supply (3 volts) is needed.

Figure 9:
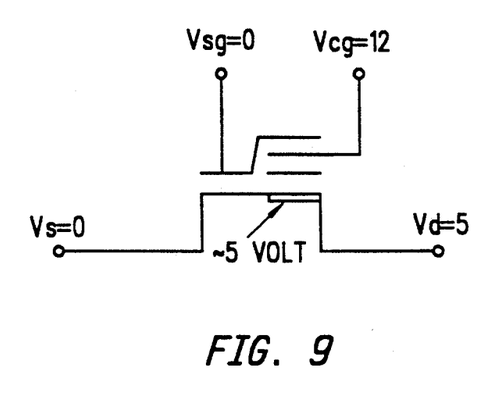
FIG. 9 shows the bias conditions during programming for the device in FIG. 4.

For the unselected memory cells along the same column as the P1 cell, such as P2, P3, P4, P5, P6, P7, and P8, the drains of the unselected cells are all at 5 volts and their control gates are all at 12 volts. The voltage bias conditions for cells P2 to P8 during the programming of cell P1 have been shown in FIG. 9. Since the channel region underneath the floating gate has been heavily turned on by the high control gate voltage, the 5 volts drain voltage will be transferred to this channel region such that the substrate surface potential of the channel region underneath the floating gate is very close to 5 volts. The 5 volts surface potential and 12 volts on control gate result in 7 volts difference between the control gate and the substrate which makes the electric field between the floating gate and the substrate about 3.5 MV/cm if 50% control gate coupling is used. This situation is very different from the gate disturb condition as shown in FIG. 1C in which the control gate is at 12 volts and the substrate surface potential underneath the floating gate is kept at 0 volts, and thus results in about 6 MV/cm of electric field between the floating gate and the substrate for the case as shown in FIG. 1C. The reduced electric field between the floating gate and the substrate for the case as shown in FIG. 1C. The reduced electric field between the floating gate and the substrate prevent the array architecture as shown in FIG. 8 from having the gate disturb compared to the prior art. Moreover, as shown in FIG. 9, since the drain voltage is lower than the control gate voltage, there is no drain disturb concern as shown in FIG. 1D. Thus, the memory array architecture in this invention is more immune to the gate and drain disturbances. This makes the unselected cells immune to the drain and gate disturbance which are common problems in the prior art cell arrays.

In this array architecture, the memory cells sharing the same drain line are treated as a memory block. To erase the selected block of memory cells such as P1, P2, P3, P4, P5, P6, P7, P8, 5 volts are applied on the drain line D1 and −11 volts are applied to the control gates CG1 and CG2. All the other drain lines are 0 volt and all the source lines are floating, and all the select gate lines are also 0 volt during erase operation. The floating gate charge in cells P1, p2, p3 p4, p5, P6, P7, and P8 will be erased simultaneously through the tunneling process between the floating gates and the drain. All the unselected cells P9, P10, P11, P12, P13, P14, P15, and P16 will not have any voltage stress on the drain or control gate and will not create any disturb condition during the erase operation.

During a read operation of the selected cell P1, a relatively high voltage of about 2 volts can be applied to the source line S1, 5 volts are applied to the control gate CG1 and select gate SG1. The 2 volts of source voltage is considered relatively high because the read voltage usually is about 1 volt for the prior art memory circuit in FIG. 1B. This is because the channel doping is usually very high in the device of FIG. 1A for optimizing the programming. However, this also enhances the programming during the read operation (read disturb) since certain voltage is applied to the drain and the gate during a read operation. Due to this read disturb, the read voltage on the drain usually is limited to about 1 volt for the prior art. However, in the present invention, since the source is not adjacent to the floating gate there is no read disturbance if the read voltage is applied to the source line.

Operating conditions for the memory array are shown in Table 1.

|  | CG1 | CG2 | CG3 | CG4 | D1 | D2 | D3 | S1 | S2 | SG1 | SG2 | SG3 | SG4 |
|---|---|---|---|---|---|---|---|---|---|---|---|---|---|
| Program P1 | 12 | 0 | 0 | 0 | 5 | 0 | 0 | 0 | 5 | 2 | 0 | 0 | 0 |
| Erase P1~P8 | −11 | −11 | 0 | 0 | 5 | F | F | F | F | 0 | 0 | 0 | 0 |
| Read P1 | 5 | 0 | 0 | 0 | 0 | 0 | 0 | 2 | 0 | 5 | 0 | 0 | 0 |

By using the memory array architecture of the present invention, a single low voltage power supply can be used for memory circuit operation. If further reduction in power supply (such as 3 volts) is required, the 5 volts drain voltage can be easily obtained from a charge pump circuit. All the disturbance conditions occurring in the prior art during program, erase, and read operations can be eliminated by using the memory array architecture.

While the invention has been described with reference to specific embodiments, the description is illustrative of the invention and is not to be construed as limiting the invention. Various modifications and applications may occur to those skilled in the art without departing from the true spirit and scope of the invention as defined in the appended claims.

What is claimed is:

1. A flash EPROM memory array comprising
   a plurality of memory cells arranged in a matrix of rows and columns, each memory cell including
   a portion of a semiconductor substrate of a first conductivity type,
   a source region and a drain region of a second conductivity type formed in spaced alignment in said substrate with a channel region therebetween,
   a first gate insulation formed on a major surface of said substrate, A floating gate electrode formed on said first gate insulation and partially overlapping said channel region, a second gate insulation formed on said floating gate, a control gate formed on said second gate insulation and overlapping said floating gate electrode, said drain region being self-aligned with said floating gate and said control gate with said source region being laterally spaced from said floating gate, a third insulation layer formed over said control gate electrode, said floating gate electrode and said channel region;

a select gate electrode formed on said third insulation layer and over said channel region abutting said source region, said control gate electrode extending from said cell in one direction to adjacent cells in a column, said select gate electrode extending over said drain region, said source region, and said control gate electrode and from said cell in a direction perpendicular to said one direction to adjacent cells in a row, means connecting said drain regions of memory cells in columns, means connecting said source regions of memory cells in columns, means connecting said control gate electrodes of memory cells in columns, and means connecting said select gate electrodes of memory cells in rows perpendicular to said columns wherein programming of a cell is by charge injection from a source region into a floating gate and erasure of a programmed cell is by charge transfer from a floating gate to a drain region.

2. The flash EPROM memory array as defined by claim wherein drain columns and source columns are arranged alternatively on said substrate.

3. The flash EPROM memory array as defined by claim 2 wherein each cell is programmed by hot electron injection from the source side of the floating gate to said floating gate electrode, and each cell is erased by electron tunneling through said first gate insulation from said floating gate electrode to said drain electrode.

4. The flash EPROM memory array as defined by claim 3 wherein each cell is programmed by applying a position voltage (5 volts) to said drain region, a positive voltage (12 volts) to said control electrode, a voltage (1.5 to 2 volts) to said select electrode, and each cell is erased by applying a positive voltage (5 volts) on said drain region and a negative voltage ($-11$ volts) on said control gate electrode.

5. The flash EPROM memory array as defined by claim 3 wherein said drain region is self-aligned with said floating gate whereby memory cells connected to a common drain line have reduced drain and gate disturbance during the programming of one cell connected to said common drain line, high voltage is not applied on unselected memory cells during the erase of selected memory cells, and no read disturbance occurs from application of a read voltage on the source region.

* * * * *